United States Patent
Igarashi et al.

(10) Patent No.: US 6,949,470 B2
(45) Date of Patent: Sep. 27, 2005

(54) METHOD FOR MANUFACTURING CIRCUIT DEVICES

(75) Inventors: Yusuke Igarashi, Gunma (JP); Hideki Mizuhara, Aichi (JP); Noriaki Sakamoto, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 180 days.

(21) Appl. No.: 10/664,333

(22) Filed: Sep. 17, 2003

(65) Prior Publication Data

US 2004/0097086 A1 May 20, 2004

(30) Foreign Application Priority Data

Sep. 26, 2002 (JP) .................................... P. 2002-281887

(51) Int. Cl.$^7$ ............................................. H01L 21/302
(52) U.S. Cl. ...................... 438/754; 438/106; 438/127; 29/841; 29/847; 29/854; 29/855; 216/95; 216/96; 216/106
(58) Field of Search ............................ 216/95, 96, 105, 216/106; 438/106, 127, 745, 754; 148/DIG. 105; 29/831, 832, 841, 846, 847, 854, 855

(56) References Cited

U.S. PATENT DOCUMENTS

| 5,135,606 A | * | 8/1992 | Kato et al. ..................... 216/20 |
| 5,258,649 A | * | 11/1993 | Tanaka et al. ............... 257/787 |
| 6,133,070 A | * | 10/2000 | Yagi et al. .................... 438/121 |
| 2004/0092129 A1 | | 5/2004 | Igarashi et al. |
| 2004/0097081 A1 | | 5/2004 | Mizuhara et al. |
| 2004/0101995 A1 | | 5/2004 | Sakai et al. |
| 2004/0106235 A1 | | 6/2004 | Igarashi et al. |
| 2004/0106288 A1 | | 6/2004 | Igarashi et al. |

* cited by examiner

Primary Examiner—Nadine G. Norton
Assistant Examiner—Eric B. Chen
(74) Attorney, Agent, or Firm—Fish & Richardson P.C.

(57) ABSTRACT

Priorly, semiconductor devices wherein a flexible sheet with a conductive pattern was employed as a supporting substrate, a semiconductor element was mounted thereon, and the ensemble was molded have been developed. In this case, problems occur that a multilayer wiring structure cannot be formed and warping of the insulating resin sheet in the manufacturing process is prominent. In order to solve these problems, a laminated plate 10 formed by laminating a first conductive film 11 and a second conductive film 12 is covered with a photoresist layer PR having opening portions 13 with inclined surfaces 13S, a conductive wiring layer 14 is formed in the opening portions by electrolytic plating to form inverted inclined surfaces 14R, and then, when covering the same with the sealing resin layer 21, an anchoring effect is produced by making the sealing resin layer 21 bite into the inverted inclined surfaces 14R so as to strengthen bonding of the sealing resin layer 21 with the conductive wiring layer 14.

9 Claims, 6 Drawing Sheets

METHOD FOR MANUFACTURING CIRCUIT DEVICES

BACKGROUND OF THE INVENTION

1. Field of the Invention

The present invention relates to a method for manufacturing circuit devices, and particularly, to a method for manufacturing a low-profile circuit device using a conductive wiring layer with an anchoring effect whose circumference has an inverted inclined surface.

2. Description of the Related Art

In recent years, IC packages have increasingly been used in portable equipment and small-sized high-density mounting equipment, and conventional IC packages and mounting concepts have undergone drastic changes. This has been mentioned in, for example, Japanese Unexamined Patent Publication No. 2000-133678, which is a technique related to a semiconductor device employing a polyimide resin sheet of a flexible sheet as an example of its insulating resin sheet.

In FIG. 10 through FIG. 12, a flexible sheet 50 is employed as an interposer substrate. Herein, drawings shown in the upper part of the respective drawings are plan views, drawings shown in the lower part are sectional views along a line A—A.

First, on the flexible sheet 50 shown in FIG. 10, a copper foil pattern 51 is prepared by being adhered via an adhesive. This copper foil pattern 51 is different in its pattern depending on whether a semiconductor element to be mounted is a transistor or an IC, and in general, bonding pads 51A and an island 51B are formed. In addition, a symbol 52 shows an opening portion to lead out an electrode from the rear surface of the flexible sheet 50, and the copper foil pattern 51 is exposed therethrough.

Next, this flexible sheet 50 is transferred to a die bonder, and as shown in FIG. 11, semiconductor elements 53 are mounted. Thereafter, this flexible sheet 50 is transferred to a wire die bonder, and the bonding pads 51A and pads of the semiconductor elements 53 are electrically connected by metal wires 54.

Lastly, as in FIG. 12A, a sealing resin 55 is provided on the front surface of the flexible sheet 50 for sealing. Herein, transfer molding is performed so as to cover the bonding pads 51A, island 51B, semiconductor element 53, and metal wires 54.

Thereafter, as shown in FIG. 12B, connecting means 56 such as solder or solder balls are provided, and as a result of passing through a solder reflow furnace, spherical solder 56 fusion-bonded with the bonding pads 51A via the opening portions 52 are formed. In addition, since the semiconductor elements 53 are formed in a matrix shape on the flexible sheet 50, dicing is performed as in FIG. 12 to separate the semiconductor elements individually.

In addition, in the sectional view shown in FIG. 12C, 51A and 51D are formed as electrodes on both surfaces of the flexible sheet 50. In general, this flexible sheet 50 is supplied after patterning of both surfaces by a manufacturer.

A semiconductor device using the above-described flexible sheet 50 uses no widely-known metal frame and, therefore, has an advantage such that an extremely small-sized low-profile package structure can be realized, however, substantially, wiring is carried out by only one-layer copper pattern 51 provided on the front surface of the flexible sheet 50. Therein exists a problem such that, since the flexible sheet is flexible, distortion occurs before and after a pattern formation of a conductive film, and this is not suitable for a multilayer wiring structure since displacement between laminated layers is great.

In order to improve supporting strength to suppress the sheet distortion, it is necessary to sufficiently thicken the flexible sheet 50 to approximately 200 µm, and this goes against a reduction in thickness.

Furthermore, in terms of a manufacturing method, in the aforementioned manufacturing devices, for example, in the die bonder, wire bonder, transfer molding device, reflow furnace, etc., the flexible sheet 50 is transferred and attached to a part called a stage or a table.

However, when the thickness of an insulating resin to serve as a base of the flexible sheet 50 is reduced to approximately 50 µm, if the thickness of the copper foil pattern 51 formed on the front surface is also thin such as 9–35 µm, transferring characteristics are considerably inferior due to warping as shown in FIG. 13, and attaching characteristics to the aforementioned stage or table are inferior, therein exists a drawback. This is considered to be warping owing to that the insulating resin itself is considerably thin and warping owing to a difference in the thermal expansion coefficient between the copper foil pattern 51 and insulating resin.

In addition, since the part of the opening portions 52 is pressured from the upside during molding, a force to warp the circumferences of the bonding pads 51A upward can act to deteriorate the bonding pads 51A in adhesive properties.

In addition, if the resin material itself to form a flexible sheet 50 lacks flexibility or if a filler is mixed to enhance thermal conductivity, the flexible sheet 50 becomes rigid. In this condition, when bonding is performed by a wire bonder, the bonding part can crack. In addition, during transfer molding, the part where the metal mold is brought into contact can crack. This appears more prominently if warping exists as shown in FIG. 13.

Although the flexible sheet 50 described above can be a flexible sheet on whose rear surface no electrode is formed, an electrode 51D can be formed, as shown in FIG. 12C, on the rear surface of the flexible sheet 50, as well. In this case, since the electrode 51D is brought into contact with the manufacturing devices or is brought into contact with the transferring surfaces of transferring means between the manufacturing devices, there exists a problem such that damage occurs to the rear surface of the electrode 51D. Since the electrode is formed with this damage included, there also exist problems, such that the electrode 51D itself cracks afterward by a heat application and solder wettability declines in a solder connection to a motherboard.

In addition, during transfer molding, a problem also occurs such that a sufficient sealing structure cannot be realized because of weak adhesive properties between the flexible sheet 50, copper foil pattern 51 and the insulating resin.

SUMMARY OF THE INVENTION

First, the preferred embodiments include that a method for manufacturing circuit devices comprises: a step for preparing a substrate by laminating a first conductive film and a second conductive film to cover a principle surface of the first conductive film; a step for covering the second conductive film with a photoresist layer in a desirable pattern and having an inclined surface at opening portions; a step for selectively forming a conductive wiring layer at the opening portions of the photoresist layer and providing an inverted inclined surface around the conductive wiring layer; a step for removing the second conductive film by use of the conductive wiring layer as a mask; a step for fixedly fitting semiconductor elements on the first conductive film and electrically connecting electrodes of the semiconductor elements with predetermined parts of the conductive wiring layer; a step for covering the semiconductor elements with a sealing resin layer and making the sealing resin layer produce an anchoring effect at the inverted inclined surface of the conductive wiring layer; and a step for removing the first conductive film to expose the second conductive film positioned on the rear surface of the sealing resin layer and the conductive wiring layer. In particular, the preferred embodiments include that by forming inverted inclined surfaces around the conductive wiring layer by making use of inclined surfaces of the opening portions of the photoresist layer, an anchoring effect of the sealing resin layer is provided.

Second, the preferred embodiments include that the second conductive film is formed by silver electroplating.

Third, the preferred embodiments include that the photoresist layer is heat-treated after development so as to form an inclined surface at the opening portions.

Fourth, the preferred embodiments include that, as the photoresist layer, a positive photoresist layer is used, and an inclined surface is formed by use of inferior resolution during development.

Fifth, the preferred embodiments include that the conductive wiring layer is formed at the opening portion by copper electroplating while using the first conductive film as an electrode.

Sixth, the preferred embodiments include that an etching solution for the second conductive film is an iodine-based solution.

Seventh, the preferred embodiments include that the second conductive film and the sealing resin layer remaining when the first conductive film is etched are used as an etching stopper.

Eighth, the preferred embodiments include that a solution containing ferric chloride or cupric chloride is used as a solution to perform the etching.

Ninth, the preferred embodiments include that external electrodes are formed by adhering a brazing filler material to the remaining second conductive film.

According to the preferred embodiments, in the step for forming a conductive wiring layer, by forming inverted inclined surfaces on the conductive wiring layer by making use of inclined surfaces of a photoresist layer, an anchoring effect between the conductive wiring layer and sealing resin layer can be strengthened, therefore, an advantage is provided such that biting between the sealing resin layer and insulating wiring layer is strengthened to realize a satisfactory sealing condition.

In addition, anchor portions can be formed in self-alignment by the second conductive film depressed around the second conductive film by overetching the second conductive film by use of the conductive wiring layer as a mask, and these anchor portions are filled when the semiconductor elements are covered with the sealing resin layer later, therefore, an advantage is provided such that biting between the sealing resin layer and conductive pattern layer can be further strengthened.

Furthermore, when the first conductive film is entirely removed, the second conductive film functions as a barrier layer to etching with the sealing resin layer, therefore, an advantage is provided such that removal of the first conductive film without a mask can be made possible.

Furthermore, since the second conductive film forms a flat rear surface along with the sealing resin layer, either the land grid array structure or ball grid array structure can be employed, therefore, an advantage is provided such that the remaining third conductive film itself can construct the whole or part of the external electrodes.

DESCRIPTION OF THE PREFERRED EMBODIMENTS

Figure 1:
FIG. 1 is a sectional view for explaining a method for manufacturing circuit devices of the preferred embodiments.

A method for manufacturing circuit devices of the preferred embodiments will be described in detail with reference to FIG. 1 through FIG. 9.

A method for manufacturing circuit devices comprises: a step for preparing a substrate 10 by laminating a first conductive film 11 and a second conductive film 12 to cover a principle surface of the first conductive film 11; a step for covering the second conductive film 12 with a photoresist layer PR in a desirable pattern and having an inclined surface 13S at opening portions 13; a step for selectively forming a conductive wiring layer 14 at the opening portions 13 of the photoresist layer PR and providing an inverted inclined surface 14R around the conductive wiring layer 14; a step for removing the second conductive film 12 by use of the conductive wiring layer 14 as a mask; a step for fixedly fitting semiconductor elements 17 on the first conductive film 11 and electrically connecting electrodes of the semiconductor elements 17 with predetermined parts of the conductive wiring layer 14; a step for covering the semiconductor elements 17 with a sealing resin layer 21 and making the sealing resin layer 21 produce an anchoring effect at the inverted inclined surface 14R of the conductive wiring layer 14; and a step for removing the first conductive film 11 to expose the second conductive film 12 positioned on the rear surface of the sealing resin layer 21 and the conductive wiring layer 14. Such respective steps will be described in the following.

The first step of the preferred embodiments can be, as shown in FIG. 1, for preparing a substrate 10 by laminating a first conductive film 11 and a second conductive film 12 to cover a principle surface of the first conductive film 11.

On the front surface of the laminated plate 10, the first conductive film 11 is formed substantially throughout the whole area, and on the front surface thereof, the second conductive film 12 is formed. The first conductive film 11 is, preferably, made of Cu as a main material or is made of a widely-known lead frame material. The first conductive film 11 and second conductive film 12 can be formed by a plating method, an evaporation method, or a sputtering method, or a metal foil formed by a rolling method or a plating method can be adhered to the same. Moreover, as the first conductive film 11, Al, Fe, Fe—Ni, a widely-known lead frame material and the like can be employed.

As the material of the second conductive film 12, a material is employed which is not etched by an etchant used when the first conductive film 11 is removed. In addition, since external electrodes 24 of solder or the like are formed on the rear surface of the second conductive film 12, adhesion of the external electrodes 24 is also considered. Concretely, a conductive material composed of gold, silver, and palladium can be employed as a material of the second conductive film 12.

The first conductive film 11 is formed thick in thickness to mechanically support the ensemble, and the thickness is approximately 35–150 μm. The second conductive film 12 functions as a barrier layer when the first conductive film 11 is etched, and is formed with a thickness of approximately 2–20 μm. Accordingly, by forming the first conductive film 11 thick, flatness of the laminated plate 10 can be maintained, whereby, workability in the following steps can be improved.

Furthermore, the first conductive film 11 is damaged through various steps. However, the first conductive film 11 is to be removed in a later step, so that damage is prevented from remaining in a circuit device of a finished product. In addition, since the sealing resin can be hardened while flatness is maintained, the rear surface of a package can also be flattened, and the external electrodes formed on the rear surface of the laminated plate 10 can also be arranged flat. Therefore, electrodes on a mounting substrate can be brought into contact with the electrodes on the rear surface of the laminated plate 10, whereby a soldering failure can be prevented.

Next, a concrete manufacturing method for the aforementioned laminated plate 10 will be described. A laminated plate 10 can be manufactured by lamination, electroplating or rolling . When a laminated plate 10 is manufactured by electroplating, first, a first conductive film 11 is prepared. Then, electrodes are provided on the rear surface of the first conductive film 11 , and a second conductive film 12 is laminated by an electrolytic plating method. When a laminated plate is manufactured by rolling, a first conductive film 11 and a second conductive film 12 which have been prepared in a plate shape are joined under pressure by a roll or the like.

Figure 2:
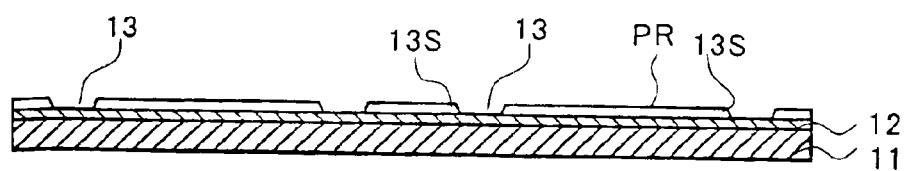
FIG. 2 is a sectional view for explaining a method for manufacturing circuit devices of the preferred embodiments.

The second step of the preferred embodiments can be, as shown in FIG. 2, for covering the second conductive film 12 with a photoresist layer PR in a desirable pattern and having an inclined surface 13S at opening portions 13.

In this step, as shown in FIG. 1, exposure and development are carried out to form opening portions 13 into a desirable pattern shape after the second conductive layer 12 is covered with a photoresist layer PR, whereby the photoresist layer PR at parts corresponding to the opening portions 13 are removed with a developer.

Next, as shown in FIG. 2, an inclined surface 13S is formed at the opening portions 13 of the photoresist layer PR. According to a first method, the photoresist layer PR after development is heat-treated to become 120–180° C. so as to form upwardly inclined surfaces 13S. According to the second method, by using a positive photoresist material as a photoresist layer PR, inclined surfaces 13S are formed, which are upwardly expanded and inclined, as a result of development of an inferior resolution.

Figure 3:
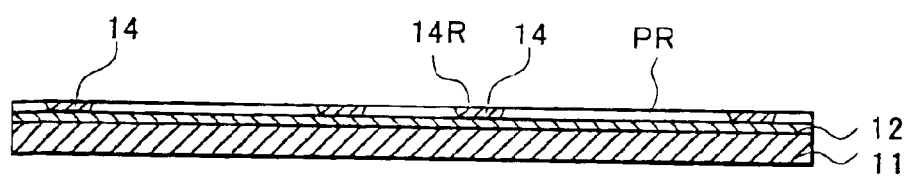
FIG. 3 is a sectional view for explaining a method for manufacturing circuit devices of the preferred embodiments.
Figure 4:
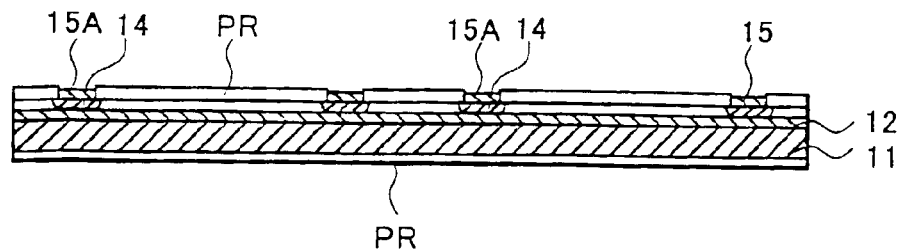
FIG. 4 is a sectional view for explaining a method for manufacturing circuit devices of the preferred embodiments.

The third step of the preferred embodiments can be, as shown in FIG. 3 and FIG. 4, for selectively forming a conductive wiring layer 14 at the opening portions 13 of the photoresist layer PR and providing an inverted inclined surface 14R around the conductive wiring layer 14.

While using the first conductive film 11 as a common electrode, a conductive wiring layer 14 is formed by selectively electroplating the opening portions 13 of the photoresist layer PR with copper. At this time, the photoresist layer PR functions as a mask, whereby a conductive wiring layer 14 is formed in a desirable pattern on the second conductive film 12 where the opening portions 13 are exposed. This conductive wiring layer 14 is formed with a thickness of approximately 20 μm so as to fill up the opening portions 13 of the photoresist layer PR, and at the circumference of the conductive wiring layer 14 to be brought into contact with the photoresist layer PR, an inverted inclined surface 14R is formed with an inverted inclination to the inclined surface 13S. In addition, for the conductive wiring layer 14, Cu has been herein employed, however, Au, Ag, Pd and the like can be employed.

Furthermore, as shown in FIG. 4, pads 15A composed of the third conductive film 15 are selectively formed on the conductive wiring layer 14. The conductive wiring layer 14 excluding regions to form pads is covered with the photoresist layer PR, a nickel base plating is applied, and then electrolytic plating is performed with gold or silver to form pads 15A. Furthermore, at this time, the rear surface of the first conductive film 11 is covered with a photoresist layer PR or an overcoat resin to prevent pads from being formed.

Figure 5:
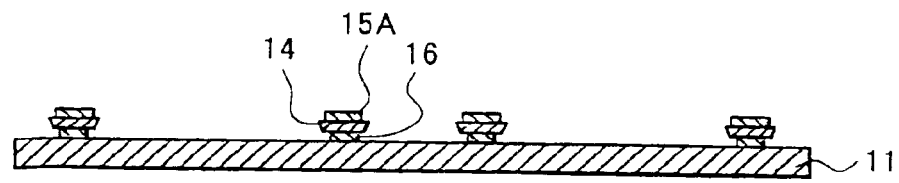
FIG. 5 is a sectional view for explaining a method for manufacturing circuit devices of the preferred embodiments.

The fourth step of the preferred embodiments can be, as shown in FIG. 5, for removing the second conductive film 12 by use of the conductive wiring layer 14 as a mask.

In this step, the photoresist layer PR is removed, and the second conductive film 12 is selectively removed by etching by use of the conductive wiring layer 14 as a maskEtchant used in this step is an etchant which etches the second conductive film 12 and does not etch the conductive wiring layer 14. That is, in a case where the conductive wiring layer 14 is formed of a material mainly of Cu and the second conductive film 12 is silver, only the second conductive film 12 can be removed by using an iodine-based etchant. In a case where the pads 15A are formed of silver, since pads 15A can be removed by this etching, it is necessary to cover pads 15A with a photoresist layer (unillustrated) for protection.

The second conductive film 12 herein remaining is to be used as external electrodes 24.

Figure 6:
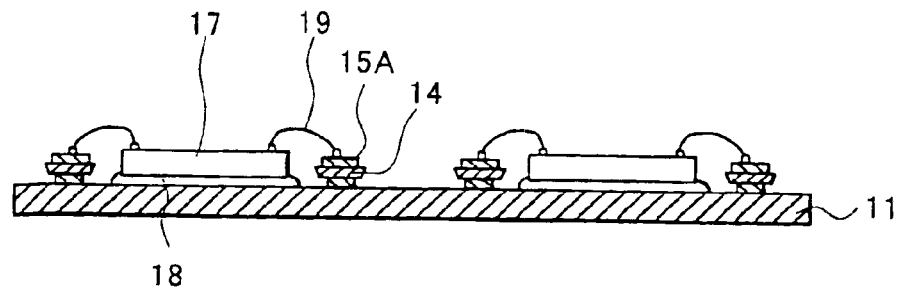
FIG. 6 is a sectional view for explaining a method for manufacturing circuit devices of the preferred embodiments.

The fifth step of the preferred embodiments can be, as shown in FIG. 6, for fixedly fitting semiconductor elements 17 on the first conductive film 11 and electrically connecting electrodes of the semiconductor elements 17 with predetermined parts of the conductive wiring layer 14.

The semiconductor elements 17 are, in the state of bare chips, die-bonded onto the first conductive film 11 with insulating adhesive resin 18.

In addition, the respective electrode pads of the semiconductor element 17 are connected to the pads 15A provided at predetermined positions of the surrounding conductive wiring layer 14 via bonding wires 19. The semiconductor element 17 can be mounted face-down. In this case, solder balls or bumps are provided on the front surfaces of the respective electrode pads of the semiconductor element 17, while on the front surface of the laminated plate 10, electrodes similar to the bonding pads of the conductive wiring layer 14 are provided at parts corresponding to the solder ball positions.

Now, an advantage of using the laminated plate 10 in wire bonding will be described. In general, when wire bonding is carried out with Au wires, this is heated to become 200° C.–300° C. At this time, if the first conductive film 11 is thin, the laminated plate 10 warps, and in this condition, if the laminated plate 10 is pressurized via a bonding head, there is a possibility that damage occurs to the laminated plate 10. However, these problems can be solved by forming the first conductive film 11 itself thick.

Figure 7:
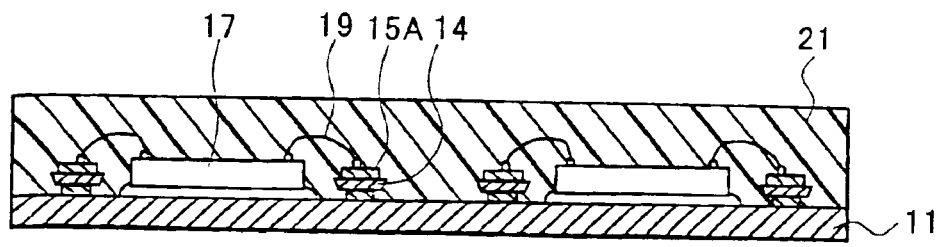
FIG. 7 is a sectional view for explaining a method for manufacturing circuit devices of the preferred embodiments.

The sixth step of the preferred embodiments can be, as shown in FIG. 7, for covering the semiconductor elements 17 with a sealing resin layer 21 and making the sealing resin layer 21 produce an anchoring effect at the inverted inclined surface 14R of the conductive wiring layer 14.

The laminated plate 10 is set in a molding device for resin molding. As a molding method, transfer molding, injection molding, coating, dipping and the like can be carried out. However, considering productivity, transfer molding and injection molding can be suitable.

In this step, when performing molding with the sealing resin layer 21, the sealing resin layer 21 is filled into the inverted inclined surface 14R of the conductive wiring layer 14 formed on the front surface of the first conductive film 11, therein exists an advantage such that bonding between the sealing resin layer 21 and conductive wiring layer 14 is strengthened by an anchoring effect.

In addition, in this step, it is necessary that the laminated plate 10 is brought into contact flat against a lower metal mold of a mold cavity, and the thick, first conductive film 11 performs this function. Moreover, even after removal from the mold cavity, flatness of the package is maintained by the first conductive film 11 until contraction of the sealing resin layer 21 is completely finished. Namely, a role is played of mechanically supporting the laminated plate 10 until this step is assumed by the first conductive film 11.

Figure 8:
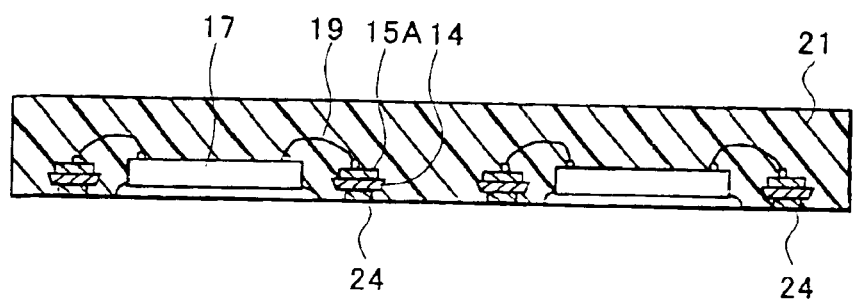
FIG. 8 is a sectional view for explaining a method for manufacturing circuit devices of the preferred embodiments.

The seventh step of the preferred embodiments can be, as shown in FIG. 8, for removing the first conductive film 11 to expose the second conductive film 12 positioned on the rear surface of the sealing resin layer 21 and the conductive wiring layer 14.

In this step, the first conductive film 11 is etched without masking so that the whole surface is removed. In this etching, chemical etching by use of ferric chloride or cupric chloride is sufficient, and the first conductive film 11 is entirely removed. By entirely removing the first conductive film 11, the remaining second conductive film 12 is exposed through the sealing resin layer 21. As described above, since the second conductive film 12 is formed of a material which is not etched by a solution to etch the first conductive film 11, the second conductive film 12 is not etched in this step.

This step includes that when the first conductive layer 11 is removed by etching, the sealing resin layer 21 and the second conductive film 12 functions as a barrier layer even without using a mask, therefore, a rear surface composed of the sealing resin layer 21 and second conductive film 12 is formed flat. Since the first conductive film 11 is entirely removed by etching, the second conductive film 12 also comes into contact with the etchant in the final stage of etching. As described above, the second conductive film 12 is formed of a material which is not etched by ferric chloride or cupric chloride to etch the first conductive film 11 made of Cu. Accordingly, since etching stops at the lower surface of the second conductive film, the second conductive film 12 functions as an etching barrier layer. Moreover, in and after this step, the ensemble is mechanically supported by the sealing resin layer 21.

Figure 9:
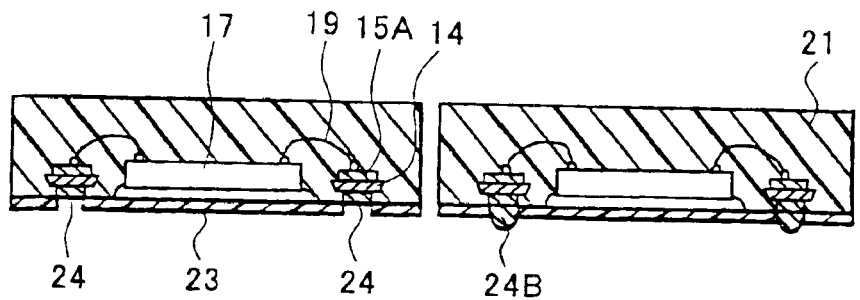
FIG. 9 is a sectional view for explaining a method for manufacturing circuit devices of the preferred embodiments.
Figure 10:
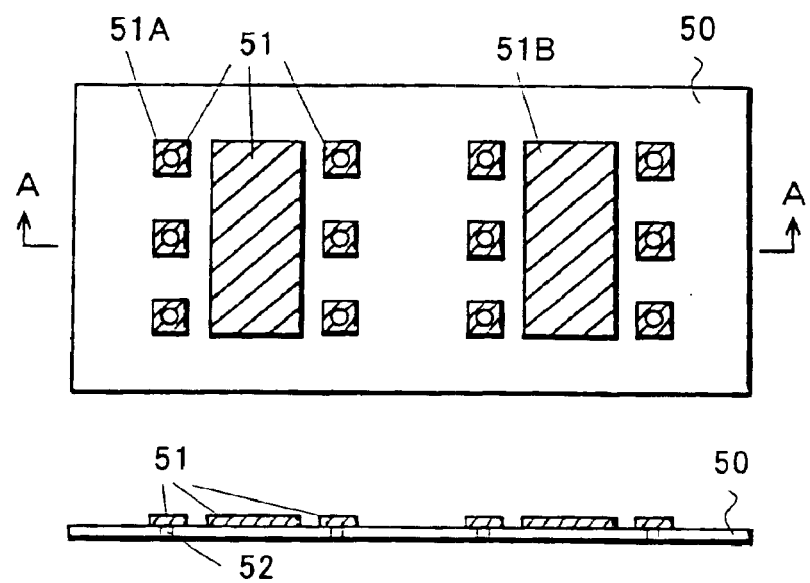
FIG. 10 is a view for explaining a conventional method for manufacturing semiconductor devices.
Figure 11:
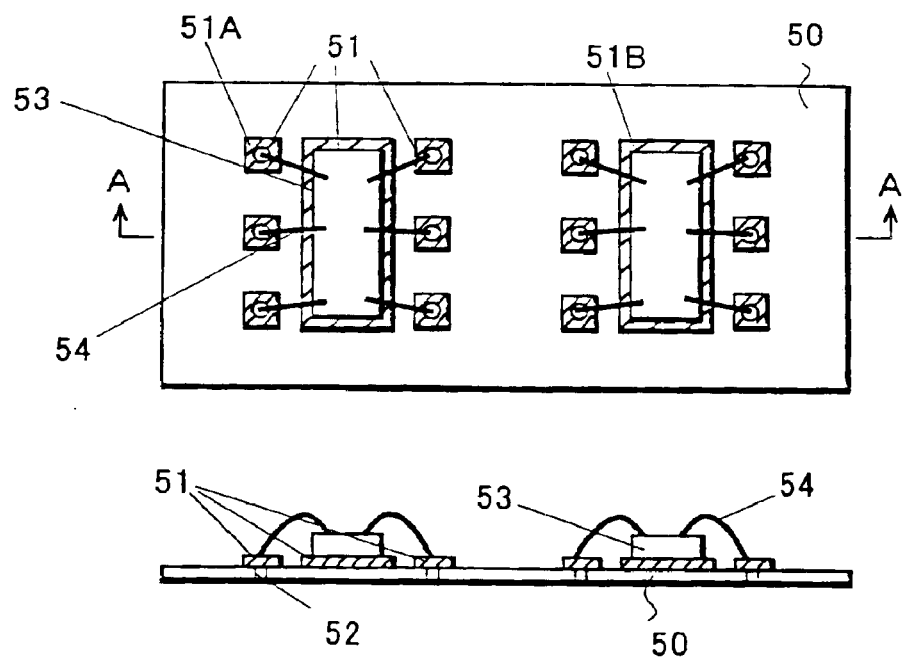
FIG. 11 is a view for explaining a conventional method for manufacturing semiconductor devices.
Figure 12A:
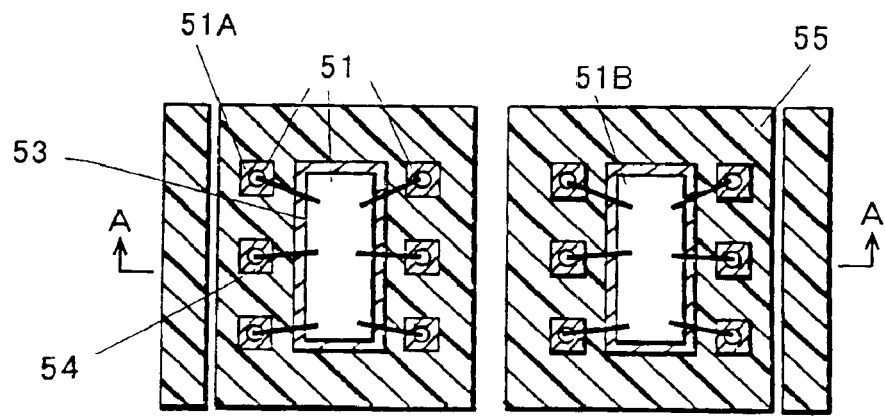
FIG. 12 is a view for explaining a conventional method for manufacturing semiconductor devices.
Figure 12B:
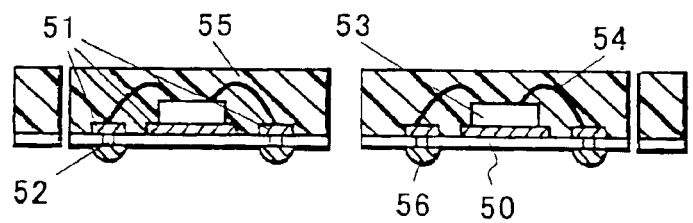
Figure 12C:
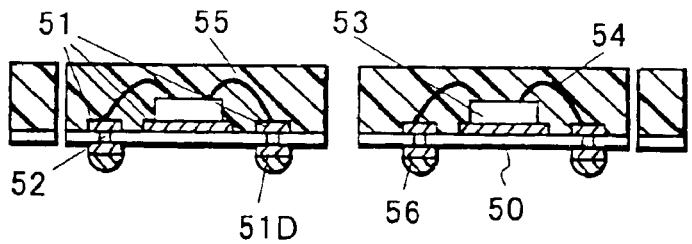
Figure 13:
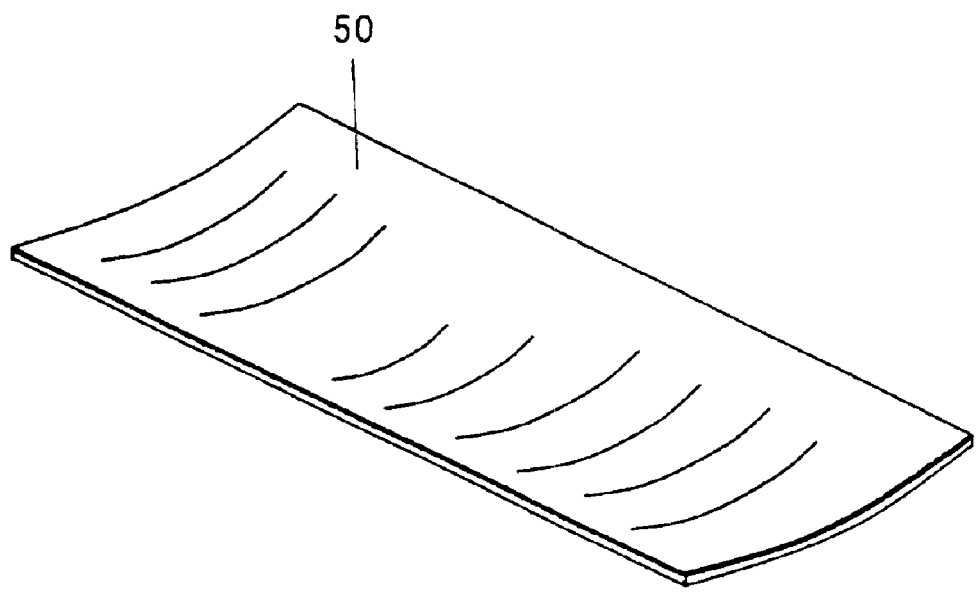
FIG. 13 is a view for explaining a conventional flexible sheet.

The last step of the preferred embodiments can be, as shown in FIG. 9, for forming a land grid array structure or a ball grid array structure.

For a land grid array structure, in the previous step where the first conductive film 11 has been entirely removed, the second conductive film 12 excluding parts to become external electrodes 24 is covered with an overcoat resin 23, and the sealing resin layer 21 and overcoat resin 23 are diced to separate these into individual circuit devices.

For a ball grid array structure, the second conductive film 12 is, for the most part, covered with an overcoat resin 23 by screen-printing with an epoxy resin dissolved in a solvent while exposing parts to form external electrodes 24. Next, by screen printing with a solder cream and a solder reflow, protruded external electrodes 24B are formed in these exposed parts. Subsequently, since a large number of circuit devices are formed on the laminated plate 10 in a matrix shape, these are separated into individual circuit devices by dicing the sealing resin layer 21 and overcoat resin 23.

In this step, since the circuit devices can be separated into individual circuit devices by dicing the sealing resin layer 21 and overcoat resin 23, frictional wear of a dicer to perform dicing can be reduced.

What is claimed is:

1. A method of manufacturing circuit devices, comprising:
   preparing a substrate by laminating a first conductive film and a second conductive film to cover a principle surface of the first conductive film;
   covering said second conductive film with a photoresist layer in a desirable pattern and having an inclined surface at opening portions;
   selectively forming a conductive wiring layer at the opening portions of said photoresist layer and providing an inverted inclined surface around said conductive wiring layer;
   removing said second conductive film by use of said conductive wiring layer as a mask;
   fixedly fitting semiconductor elements on said first conductive film and electrically connecting electrodes of said semiconductor elements with predetermined parts of said conductive wiring layer;
   covering said semiconductor elements with a sealing resin layer and making said sealing resin layer produce an anchoring effect at said inverted inclined surface of said conductive wiring layer; and
   removing said first conductive film to expose said second conductive film positioned on the rear surface of said sealing resin layer and said conductive wiring layer.

2. The method of claim 1, wherein said second conductive film is formed by silver electroplating.

3. The method of claim 1, wherein said photoresist layer is heat-treated after development so as to form an inclined surface at said opening portions.

4. The method of claim 1, wherein as said photoresist layer, a positive photoresist layer is used, and an inclined surface is formed by use of inferior resolution during development.

5. The method of claim 1, wherein said conductive wiring layer is formed at said opening portion by copper electroplating while using said first conductive film as an electrode.

6. The method of claim 1, wherein an etching solution for said second conductive film is an iodine-based solution.

7. The method of claim 1, wherein said second conductive film and said sealing resin layer remaining when said first conductive film is etched are used as an etching stopper.

8. The method of claim 6, wherein a solution containing ferric chloride or cupric chloride is used as a solution to perform said etching.

9. The method of claim 1, wherein external electrodes are formed by adhering a brazing filler material to the remaining second conductive film.

* * * * *